United States Patent [19]
Chikano

[11] Patent Number: 5,354,207
[45] Date of Patent: Oct. 11, 1994

[54] ELECTRICAL CONNECTOR WITH CONTACT ALIGNING MEMBER

[75] Inventor: Koji Chikano, Tokyo, Japan

[73] Assignee: KEL Corporation, Tokyo, Japan

[21] Appl. No.: 947,113

[22] Filed: Sep. 16, 1992

[30] Foreign Application Priority Data

Sep. 17, 1991 [JP] Japan .................................. 3-265293

[51] Int. Cl.⁵ .............................................. H01R 9/09
[52] U.S. Cl. .......................................... 439/79; 439/76
[58] Field of Search ............................ 439/76, 78–83, 439/606, 876

[56] References Cited

U.S. PATENT DOCUMENTS

| | | | |
|---|---|---|---|
| 4,857,017 | 8/1989 | Erk | 439/79 |
| 4,955,819 | 9/1990 | Harting et al. | 439/79 |
| 4,986,772 | 1/1991 | Fukutani | 439/79 |
| 5,129,832 | 7/1992 | Marsh et al. | 439/79 |
| 5,133,670 | 7/1992 | Doi et al. | 439/79 |
| 5,184,963 | 2/1993 | Ishikawa | 439/79 |
| 5,199,886 | 4/1993 | Patterson | 439/79 |
| 5,201,661 | 4/1993 | Ii | 439/79 |

FOREIGN PATENT DOCUMENTS

3133070  6/1991  Japan .
2219148 11/1989 United Kingdom .................. 439/79

*Primary Examiner*—Paula A. Bradley
*Attorney, Agent, or Firm*—Robert W. J. Usher

[57] ABSTRACT

An electrical connector has an insulating housing from a rear face of which extends a series of contact leg portions for connection to a series of conductive paths of a circuit board by a surface mount technique and a contact aligning member comprising a cover plate extending transversely from an upright wall having a bottom edge formed with a series of grooves at the same pitch as the conductive paths with respective, downwardly opening, divergent contact leg portion receiving mouths. Side walls extending rearwardly from opposite ends of the body have wall guiding surfaces intersected by a stop groove which receives a detent formed on an upright edge of the wall in a snap action when the contact aligning member is inserted downwardly between the side walls so that the respective contact leg portions enter the respective grooves, thereby being located at the same pitch as the conductive paths and in a common circuit board engaging plane.

4 Claims, 3 Drawing Sheets

ELECTRICAL CONNECTOR WITH CONTACT ALIGNING MEMBER

FIELD OF THE INVENTION

The invention relates to a circuit board connector having a contact aligning member for ensuring accurate alignment of connector contacts with circuit paths of the circuit board.

BACKGROUND OF THE INVENTION

A problem associated with circuit board connectors of the kind in which lead forming contact leg portions extend from an insulating body and have free contact ends for connection, usually by reflow soldering, to respective conductive paths of the circuit board, is that the contact leg portions may easily be deformed slightly, particularly during handling, out of pitch or out of a circuit board engaging plane with consequential risk of crossed or unreliable connection. Such deformation may also make it impossible for the free contact ends to be inserted in through-holes of a circuit board, when desired.

Japanese patent bulletin 3-133070 discloses a contact aligning member for a connector having lead receiving apertures for holding the contact leg portions at the required pitch. However, threading the respective leads into the apertures can be a difficult and time consuming operation.

The problem is exacerbated by ever increasing contact density requiring finer, more flexible leads for increasing complexity and miniaturisation.

SUMMARY OF THE INVENTION

It is an object of the invention to obviate the above-mentioned disadvantages by providing a contact aligning member which can be applied relatively easily and which shields the contact leg portions both mechanically and electrically.

According to one aspect of the invention, there is provided an electrical connector for mounting on a surface of a circuit board comprising an insulating housing body having an upper face and a lower, circuit board engaging face, a series of electrical contacts having portions anchored in the body and respective contact legs extending from the body between the upper and lower faces with respective free contact ends thereof located spaced apart from each other for connection to respective conductive paths of a series of conductive paths located at a predetermined pitch on the circuit board, a contact aligning member molded in one piece from insulating material and comprising a contact engaging portion formed with a series of contact engaging grooves with downwardly opening outwardly divergent mouths and located at the predetermined pitch, and a mounting portion located above the contact engaging portion, attachment means on the housing body and on the mounting portion interengageable to attach the contact aligning member to the housing by movement of the contact aligning member from a location above the free contact ends into depressing engagement with portions of respective contact legs adjacent the free contact ends bringing them into respective grooves thereby accurately locating the free contact ends in the same pitch as the conductive paths on the circuit board and in a con, non circuit board engaging plane.

Preferably, the housing has a rear face from which the series of contact leg portions extend and a pair of side walls extending rearwardly in spaced apart relation from the rear face on respective opposite ends of the series of contact leg portions, the attachment means including forwardly and rearwardly facing guide surfaces on respective side walls defining between them a guideway and stop portions at locations adjacent the rear and upper faces above the contact series, the contact aligning member comprising an upright wall portion having a bottom edge portion formed with the contact engaging portion and a cover plate portion extending transversely from an upper end thereof and defining a cavity therewith, the attachment means comprising detent means on respective opposite upright edges of the wall and a downwardly facing latching shoulder on respective sidewalls in the guideway so that when the contact aligning member is inserted from above through the upper face between the side walls between the with respective upright edges of the wall received in the guidway and maintained parallel to the rear face by sliding engagement with the guide surfaces during movement towards the lower face until the detent engages under the shoulder in a snap action and a portion of the cover plate adjacent a free end thereof abuts the stop portions when the free contact ends are located by the contact aligning member in the circuit board engaging plane and with contact leg portions between the free contact ends and the rear face received in the cavity so that the contact aligning member is in covering relation thereto.

Thus, the leads are captured by the divergent mouths and progressively brought into alignment during final stages of assembly movement of the contact aligning member while remaining substantially entirely protected and covered thereafter.

BRIEF INTRODUCTION TO THE DRAWINGS

A specific embodiment of an electrical connector according to the invention will now be described by way of example only and with reference to the accompanying drawings in which.

Figure 1:
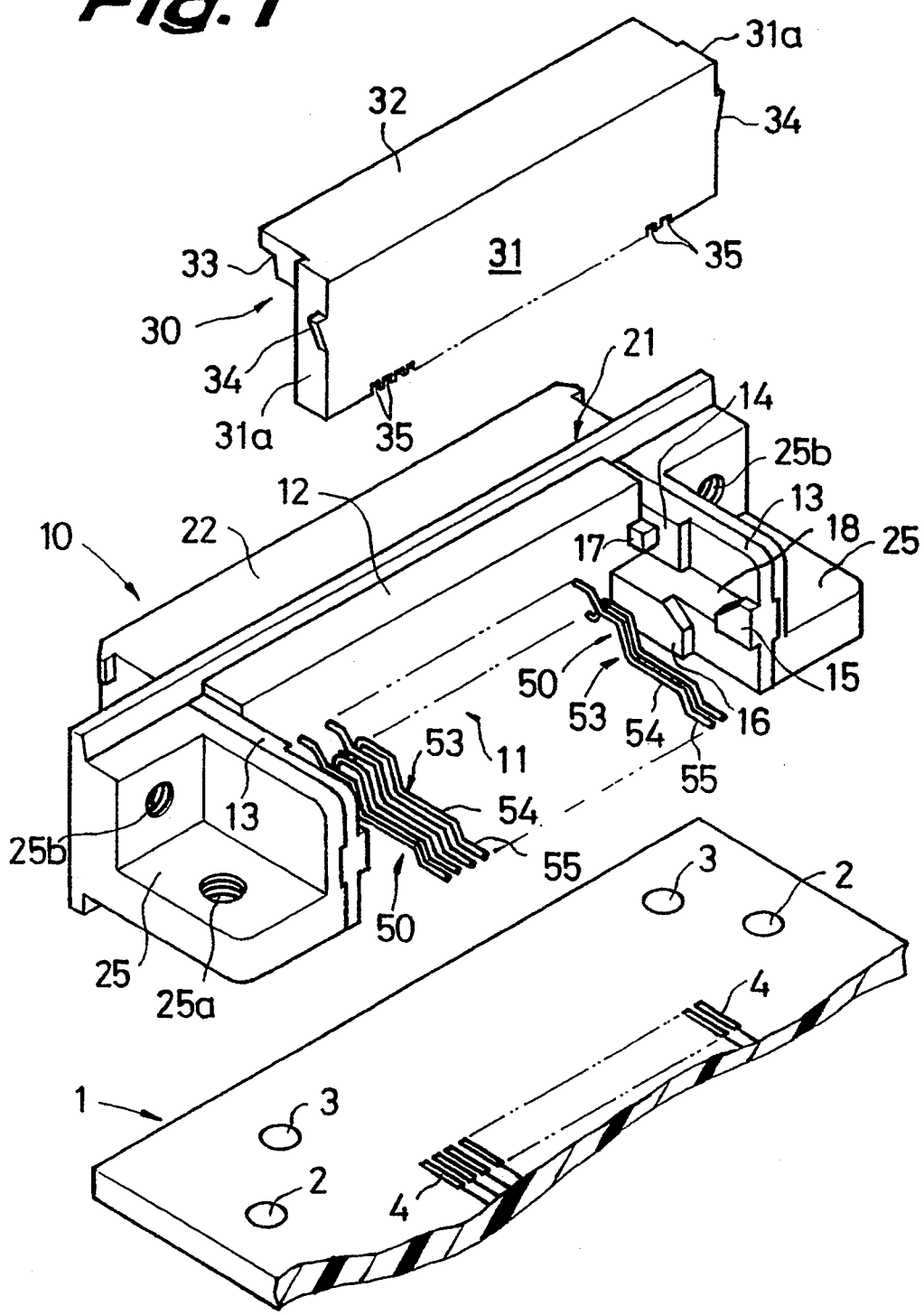
FIG. 1 is an exploded perspective view of the electrical connector in which some housing detail has been omitted for clarity.

The electrical connector includes a main, unitary housing member 10 comprising an elongate insulating housing body 11 and a metal shield joined therewith by in-molding, a series of contacts 50 retained in equally spaced apart relation in a central portion 12 of the housing body 11, and a contact aligning member 30, which locates free contact ends 55 of lead forming contact leg portions 53 of the contacts in coplanar circuit board engaging relation and at a predermined pitch corresponding that of conductive paths 4 of a circuit board 1.

Central, anchoring portions of the contacts are retained in the insulating housing body 11 at an even pitch by forcible insertion therein and subsequent in-molding.

Side wall portions 13 extend rearwardly from respective opposite ends of a rear face of the central body portion 11 and have inner surfaces formed with guide and stop portions 14–18 for mounting the contact aligning member easily and accurately on the body 11, as described below.

The first, second and third guide portions 14, 15 and 16 comprise inwardly extending projections, a fourth stop projection 17 being formed on the first projection adjacent the upper face of the housing. Guide portions 14 and 16 have aligned, vertically extending, rearwardly facing, guide surfaces 14a and 16a, respectively, while the portion 15 forms a front facing guide surface 15a parallel to thereto so that the three surfaces define between them a vertically extending guideway receiving the contact aligning member as a sliding fit.

Figure 2:
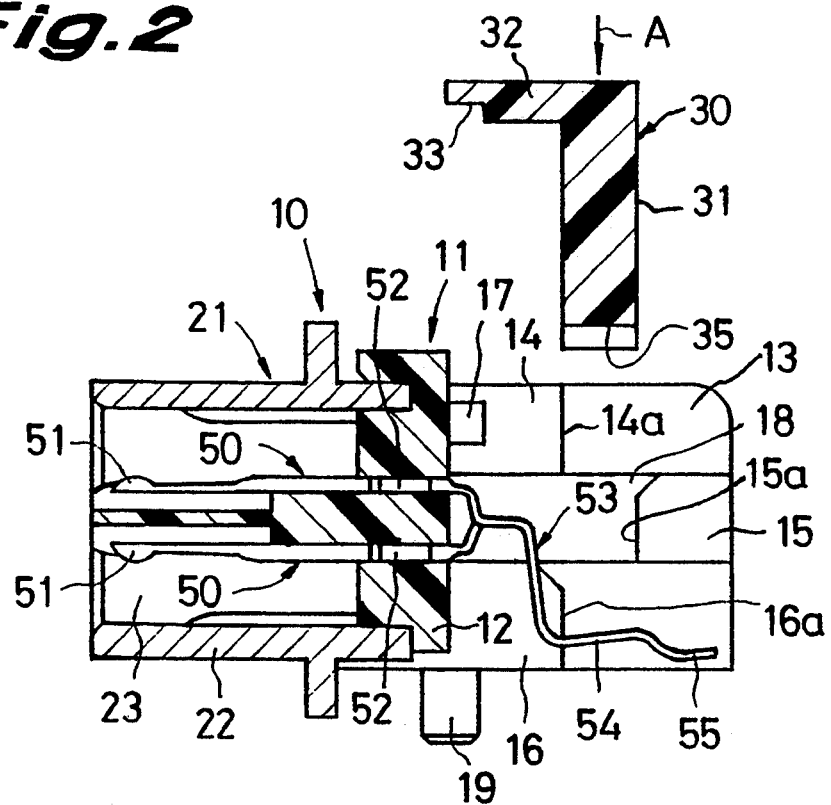
FIG. 2 is a cross-sectional view showing a contact aligning member of the connector aligned for assembly with a main housing body of the connector.
Figure 3:
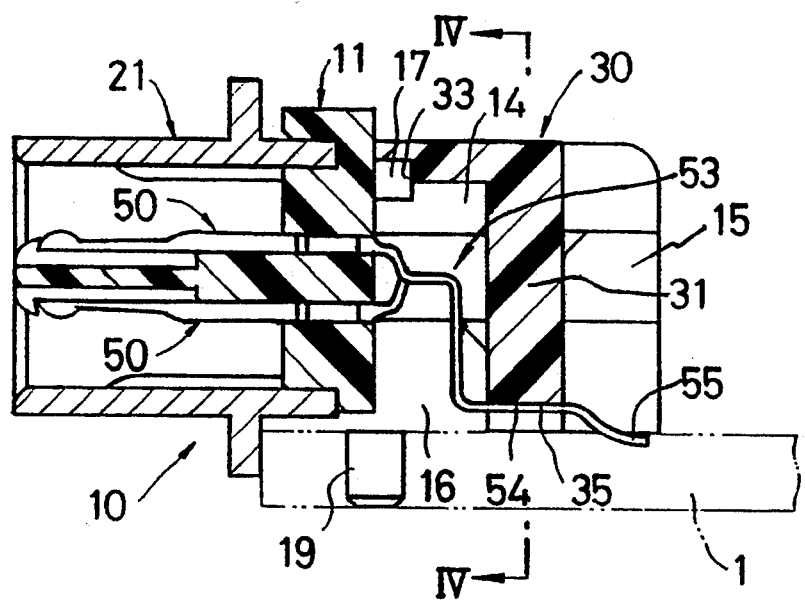
FIG. 3 is a cross-sectional view of the connector with the contact aligning member assembled with a main housing body of the connector.
Figure 4:
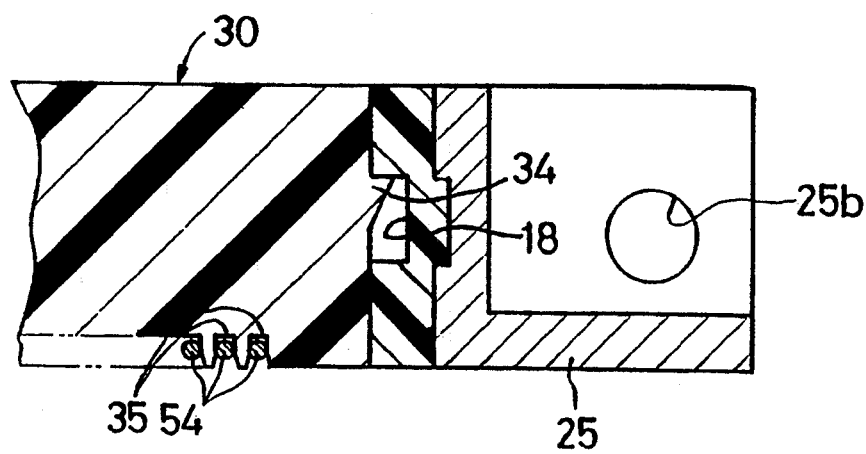
FIG. 4 is a fragmentary rear view of the assembled connector.

An insertion stop and retention groove 18 is formed in the inner surface of each side wall extending rearwardly from the rear face of the central body portion 12 between the guide portions 14 and 16 to the guide surface 15a. As shown in FIGS. 2 and 3, the contacts 50 have central portions 52 arranged as upper and lower rows with similarly located forwardly extending mating ends 51 thereof protruding into the shield socket. However, the lead forming contact leg portions 53 which extend rearwardly from the rear face of the central housing body portion 12 are initially bent towards each other to form a single row, then bent to extend orthogonally, downwardly and again bent orthogonally to extend rearwardly and finally stepped downwardly forming the rearwardly extending free contact ends which are tilted or inclined upwardly at a small angle towards their free ends prior to engagement by the contact aligning member.

The shield 21 comprises an elongate, sleeve-form hood 22 which defines a socket 23 extending forwardly from the body 11 and which has respective opposite ends formed with pairs of orthogonally arranged flanges 25, the flanges of each pair being formed, respectively, with threaded sockets 25a and 25b. The contact aligning member 30 is molded in one piece of insulating plastic with a contact engaging portion formed as an upright, elongate wall 31, from an upper end of which extends a flange-form cover plate 32 having a seat forming notch 33 in a lower surface of a free edge thereof. The wall 31 is longer than the cover plate 32 so that opposite end edge portions 31a protrude beyond the ends of the cover plate and detents 34 are formed on the protruding edge portions, as shown in FIG. 1.

A row of downwardly opening contact leg receiving grooves 35 with outwardly divergent mouths is formed along the lowermost end of the wall 31 at the same pitch as the conductive paths 4 on the circuit board.

The electrical connector is constructed for mounting on the circuit board 1 by a surface mount technique with the free contact ends connected thereto by reflow soldering. Pairs of spaced apart, connector positioning apertures 3 and connector attachment apertures 2 are formed in the circuit board. A pair of positioning posts depend from the lower surface of the body 11 in spaced apart relation for receipt in respective apertures 3.

Figure 5:
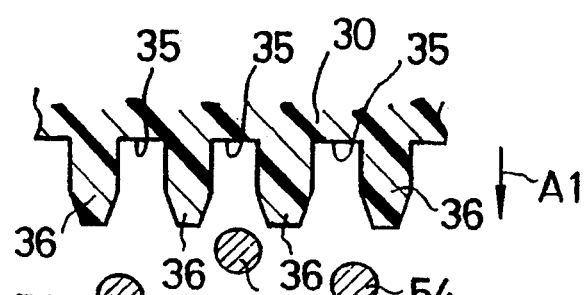
FIGS. 5A, 5B and 5C are fragmentary views showing successive stages of receipt of contact leg portions in respective grooves of the contact aligning member.
Figure 5:
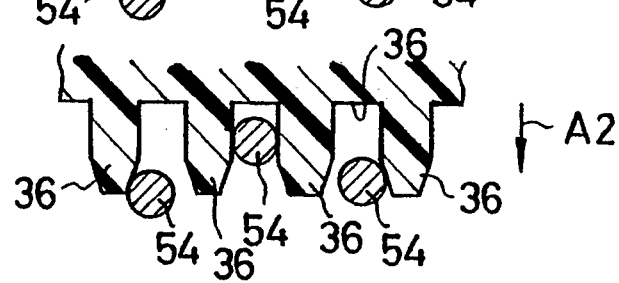
Figure 5:
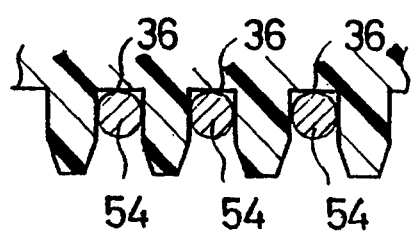

In assembling the contact aligning member 30 with the body 12, the grooved lowermost edge of the wall 31 is pushed downwardly towards the contact leg portions with opposite edge portions 31a received in the guideways in sliding engagement between guide surfaces 14a, 16a and 15. Towards the end of travel, the cover plate 32 is received between the guide portions 14 and the notch 33 ultimately seats on the stop 17, preventing further downward travel, with the detent 34 entering the groove with a snap action seating against the upper wall thereof which provides a retention shoulder, as shown in FIG. 3. During the final stages of movement, the horizontal portions 54 of the contact leg portions enter the respective grooves guided into the precise pitch of the conductive paths of the circuit board by the divergent mouths formed by tapered surfaces of groove walls 36, the engagement with respective bottoms of the grooves depressing respective free contact ends into a common circuit boardengaging plane, as shown in FIG. 5C, thereby correcting any small horizontal or vertical deviations thereof, as shown in FIGS. 5A and 5B.

The connector is then mounted on the circuit board, receipt of the posts in the apertures 3 aligning the respective free contact ends with the respective conductive paths of the circuit boardand constant contact force obviating risk of incorrect or poor and unreliable connection.

Finally the connector is secured to the circuit boardby receipt of threaded bolts through sockets 25a and apertures 2.

It will be appreciated that the cross-sections of the contacts could be rectangular instead of circular cross-section. In a further alternative, the leads could be connected to the circuit boardby soldering in apertures therein.

Assembly of the contact aligning member thus ensures both correction of any small misalignment of the leads and subsequent mechanical and electrical protection thereof to obviate risk of subsequent misalignment or short circuit.

We claim:

1. An electrical connector for mounting on a surface of a circuit board comprising an insulating housing body having an upper face and a lower, circuit board engaging face, a series of electrical contacts having portions anchored in the body and respective contact legs extending from the body between the upper and lower faces with respective free contact ends thereof located spaced apart from each other for connection to respective conductive paths of a series of conductive paths located at a predetermined pitch on the circuit board, a contact aligning member molded in one piece from insulating material and comprising a contact engaging portion formed with a series of contact engaging grooves with downwardly opening outwardly divergent mouths and located at the predetermined pitch, and a mounting portion located above the contact engaging portion, attachment means on the housing body and on the mounting portion interengageable to attach the contact aligning member to the housing by movement of the contact aligning member from a location above the free contact ends into depressing engagement with portions of respective contact legs adjacent the free contact ends bringing them into respective grooves thereby accurately locating the free contact ends in the same pitch as the conductive paths on the circuit board and in a common circuit board engaging plane.

2. An electrical connector according to claim 1 in which the housing has a rear face from which the series of contact leg portions extend and a pair of side walls extending rearwardly in spaced apart relation from the rear face on respective opposite ends of the series of contact leg portions, the attachment means including forwardly and rearwardly facing guide surfaces on respective side walls defining between them a guideway and stop portions at locations adjacent the rear and upper faces above the contact series, the contact aligning member comprising an upright wall portion having a bottom edge portion formed with the contact engaging portion and a cover plate portion extending transversely from an upper end thereof and defining a cavity therewith, the attachment means comprising detent means on respective opposite upright edges of the wall and a downwardly facing latching shoulder on respective sidewalls in the guideway so that when the contact aligning member is inserted from above through the upper face between the side walls between the with respective upright edges of the wall received in the guidway and maintained parallel to the rear face by sliding engagement with the guide surfaces during movement towards the lower face until the detent engages under the shoulder in a snap action and a portion of the cover plate adjacent a free end thereof abuts the stop portions when the free contact ends are located by the contact aligning member in the circuit board engaging plane and with contact leg portions between the free contact ends and the rear face received in the cavity so that the contact aligning member is in covering relation thereto.

3. An electrical connector according to claim 2 in which the contact leg portions extend from the rear face initially as two vertically spaced apart rows and are bent to form a single row including rearwardly and downwardly extending portions.

4. An electrical connector according to claim 3 in which a free end of the cover plate is formed with a locating recess in which the stop portions seat.

* * * * *